(12) United States Patent
Wu

(10) Patent No.: US 11,791,225 B2
(45) Date of Patent: *Oct. 17, 2023

(54) SEMICONDUCTOR STRUCTURE AND FABRICATION METHOD THEREOF

(71) Applicant: CHANGXIN MEMORY TECHNOLOGIES, INC., Hefei (CN)

(72) Inventor: PingHeng Wu, Hefei (CN)

(73) Assignee: CHANGXIN MEMORY TECHNOLOGIES, INC, Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,893

(22) Filed: May 17, 2022

(65) Prior Publication Data

US 2022/0278003 A1  Sep. 1, 2022

Related U.S. Application Data

(63) Continuation of application No. 17/372,526, filed on Jul. 12, 2021, now Pat. No. 11,335,611, which is a continuation of application No. PCT/CN2020/097150, filed on Jun. 19, 2020.

(30) Foreign Application Priority Data

Nov. 7, 2019 (CN) .......................... 201911080780.4

(51) Int. Cl.
  *H01L 21/00*   (2006.01)
  *H01L 21/66*   (2006.01)
(52) U.S. Cl.
  CPC .................................. *H01L 22/32* (2013.01)

(58) Field of Classification Search
  CPC .......................... H01L 22/32; H01L 22/02118
  USPC ............................................................ 257/48
  See application file for complete search history.

(56) References Cited

U.S. PATENT DOCUMENTS

| 2003/0168715 | A1* | 9/2003 | Bae ...................... H01L 23/585 257/E23.15 |
| 2009/0057842 | A1* | 3/2009 | He ......................... H01L 22/32 257/E23.179 |
| 2013/0342231 | A1 | 12/2013 | Alfano et al. |
| 2015/0061713 | A1* | 3/2015 | Shia ................... G01R 1/06733 29/829 |
| 2015/0200146 | A1 | 7/2015 | Reber et al. |
| 2015/0262897 | A1* | 9/2015 | Chen ..................... G02F 1/1368 257/48 |

(Continued)

*Primary Examiner* — Dzung Tran
(74) *Attorney, Agent, or Firm* — KILPATRICK TOWNSEND & STOCKTON LLP

(57) ABSTRACT

The embodiments relate to a semiconductor structure and a fabrication method thereof. The fabrication method includes: providing a wafer, in the wafer there being provided with a scribe line, in the scribe line there being provided with a test pad, a first test structure, and a second test structure; the second test structure being positioned below the first test structure, and a transverse pitch between the second test structure and the first test structure being at least equal to a width of the test pad; forming a protective layer on the wafer, the protective layer at least covering the scribe line; and performing exposure and development on the protective layer, such that a thickness of the protective layer remained above the first test structure is greater than that of the protective layer remained above the second test structure.

5 Claims, 5 Drawing Sheets

Provide a wafer, in the wafer there being provided with a scribe line, in the scribe line there being provided with a test pad, a first test structure, and a second test structure; the second test structure being positioned below the first test structure, and a transverse pitch between the second test structure and the first test structure being at least equal to a width of the test pad — S11

Form a protective layer on the wafer, the protective layer at least covering the scribe line — S12

Perform exposure and development on the protective layer, such that a thickness of the protective layer remained above the first test structure is greater than that of the protective layer remained above the second test structure — S13

(56) References Cited

U.S. PATENT DOCUMENTS

| | | | |
|---|---|---|---|
| 2016/0064294 A1* | 3/2016 | Reber | H01L 23/585 257/737 |
| 2019/0035750 A1 | 1/2019 | Han et al. | |
| 2019/0139841 A1 | 5/2019 | Stamper et al. | |

* cited by examiner

```
┌─────────────────────────────────────────────────────────────────┐
│ Provide a wafer, in the wafer there being provided with a scribe line, in the scribe line │
│ there being provided with a test pad, a first test structure, and a second test structure;│─── S11
│ the second test structure being positioned below the first test structure, and a          │
│ transverse pitch between the second test structure and the first test structure being at  │
│ least equal to a width of the test pad                                                    │
└─────────────────────────────────────────────────────────────────┘
                                    ▼
┌─────────────────────────────────────────────────────────────────┐
│ Form a protective layer on the wafer, the protective layer at least covering the scribe │─── S12
│ line                                                                                    │
└─────────────────────────────────────────────────────────────────┘
                                    ▼
┌─────────────────────────────────────────────────────────────────┐
│ Perform exposure and development on the protective layer, such that a thickness of      │─── S13
│ the protective layer remained above the first test structure is greater than that of the│
│ protective layer remained above the second test structure                               │
└─────────────────────────────────────────────────────────────────┘
```

Fig.1

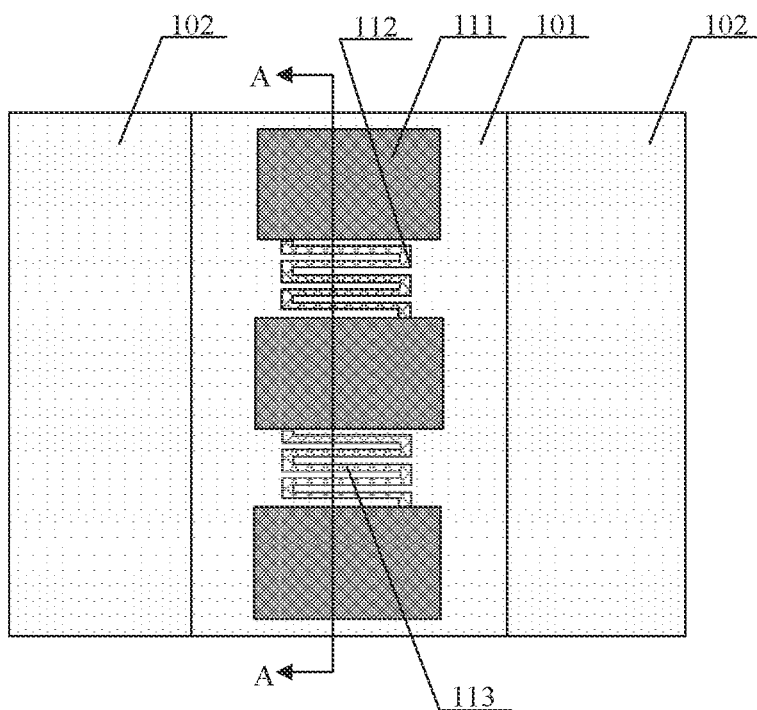

Fig.2

SEMICONDUCTOR STRUCTURE AND FABRICATION METHOD THEREOF

CROSS REFERENCE

The present disclosure is a continuation of U.S. patent application Ser. No. 17/372,526, filed on Jul. 12, 2021, which is a continuation of PCT/CN2020/097150, filed on Jun. 19, 2020, which claims priority to Chinese Patent Application No. 201911080780.4, titled "SEMICONDUCTOR STRUCTURE AND FABRICATION METHOD THEREOF" and filed on Nov. 7, 2019, the entire contents of which are incorporated herein by reference as a part of the present disclosure.

TECHNICAL FIELD

The present disclosure relates to the field of semiconductor device fabrication technologies, and more particularly, to a semiconductor structure and a fabrication method thereof.

BACKGROUND

Separating chips in a wafer along scribe lines is involved in the semiconductor wafer fabrication. Blade sawing is carried out using saw blades after the completion of wafer-level front-end-of-line processing and wafer thinning. In this process, if there is a large quantity of protective layers (for example, polyimide) remained in the scribe lines, it is prone to causing a problem that the protective layers stick to the saw blades in the process of blade sawing. If this problem happens, it is required to additionally increase the frequency of maintaining and cleaning the saw blades, which may lead to a reduction in production capacity and an increase in fabrication costs.

SUMMARY

For this reason, it is necessary to provide a semiconductor structure and a fabrication method thereof to solve the problem of reduction in production capacity and increase in fabrication costs, which is caused by the requirement for additionally increasing the frequency of maintaining and cleaning saw blades to which protective layers stick in the process of blade sawing because there is a large quantity of protective layers remained in scribe lines of semiconductor structures in the existing technologies.

To achieve the above objective, in one aspect, the present disclosure provides a method for fabricating a semiconductor structure, which includes following steps.

A wafer is provided, in the wafer there is provided with a scribe line, and in the scribe line there is provided with a test pad, a first test structure, and a second test structure. The second test structure is positioned below the first test structure, and a transverse pitch between the second test structure and the first test structure is at least equal to a width of the test pad.

On the wafer there is formed a protective layer at least covering the scribe line.

The protective layer is exposed and developed, such that a thickness of the protective layer remained above the first test structure is greater than that of the protective layer remained above the second test structure.

According to the method for fabricating the semiconductor structure, the protective layer above the second test structure is removed and thinned, such that the quantity of the protective layer in the scribe line may be reduced. When sawing the wafer using a saw blade, the protective layer may be prevented from sticking to the saw blade, and thus a production capacity is increased, and fabrication costs are saved.

In one embodiment, the performing exposure and development on the protective layer includes following steps.

A first photomask is placed above the protective layer, and there is formed a first light-transmitting area in an area, to which the first photomask corresponds, of the scribe line other than the first test structure.

A first exposure is performed on the protective layer based on the first photomask at a first exposure dose or a first exposure energy.

The first photomask is removed, and a second photomask is placed above the protective layer, wherein there is formed a second light-transmitting area in an area, to which the second photomask at least corresponds, of the test pad.

A second exposure is performed on the protective layer based on the second photomask at a second exposure dose or a second exposure energy. The second exposure dose is a minimum exposure dose at which the protective layer in an exposure area of the second exposure is completely removed after subsequent development. The second exposure energy is a minimum exposure energy at which the protective layer in the exposure area of the second exposure is completely removed after the subsequent development. The second exposure dose is greater than the first exposure dose, and the second exposure energy is greater than the first exposure energy.

A development is performed on the exposed protective layer, such that the thickness of the protective layer remained above the first test structure is greater than that of the protective layer remained above the second test structure after the development.

In one embodiment, the performing exposure and development on the protective layer includes following steps.

A photomask is placed above the protective layer, wherein there is formed a plurality of first light-transmitting areas in an area, to which the photomask corresponds, of the scribe line other than the first test structure; and there is formed a second light-transmitting area in an area, to which the photomask at least corresponds, of the test pad.

The protective layer is exposed based on the photomask.

A development is performed on the exposed protective layer, such that the thickness of the protective layer remained above the first test structure is greater than that of the protective layer remained above the second test structure after the development.

In the above example, the protective layer above the first test structure is thinned or removed, such that it may be ensured that the thickness of the protective layer covering the first test structure can meet needs of tests, thereby avoiding risks of poor test quality.

In one embodiment, the plurality of first light-transmitting areas are arranged in strips at intervals, or are arranged in grids, or are arranged randomly.

In one embodiment, before forming the protective layer on an upper surface of the wafer, the fabrication method further includes a step of forming a passivation layer on the upper surface of the wafer. The protective layer is formed on an upper surface of the passivation layer. After the development, the fabrication method further includes: curing the protective layer; and removing the passivation layer above the test pad and a part of the wafer by etching to reveal the test pad.

In one embodiment, the thickness of the protective layer remained above the first test structure is 1.5 to 4 times that of the protective layer remained above the second test structure.

The present disclosure also provides a semiconductor structure, which includes:

a wafer having a scribe line internally provided with a test pad;

a first test structure positioned in the scribe line;

a second test structure positioned in the scribe line and below the first test structure, wherein a transverse pitch between the second test structure and the first test structure is at least equal to a width of the test pad; and a protective layer positioned above the first test structure and the second test structure, wherein the thickness of the protective layer above the first test structure is greater than that of the protective layer above the second test structure.

In the above semiconductor structure, the thickness of the protective layer above the second test structure in the scribe line is smaller than that of the protective layer above the first test structure, which may reduce the quantity of the protective layer in the scribe line. When sawing the wafer using a saw blade, the protective layer may be prevented from sticking to the saw blade, and thus a production capacity is increased, and fabrication costs are saved. In one embodiment, the protective layer includes a polyimide layer or a polybenzox layer.

In one embodiment, the semiconductor structure further includes a passivation layer, which is positioned on the upper surface of the wafer; and the protective layer is positioned on the upper surface of the passivation layer.

In one embodiment, an opening is formed in the protective layer, and the test pad is revealed in the opening.

In one embodiment, the thickness of the protective layer above the first test structure is 1.5 to 4 times that of the protective layer above the second test structure.

In the above example, the protective layer above the first test structure in the scribe line is not thinned or removed, such that it may be ensured that the thickness of the protective layer covering the first test structure can meet the needs of tests, thereby avoiding risks of poor test quality.

BRIEF DESCRIPTION OF THE DRAWINGS

FIG. 1 is a flowchart of a method for fabricating a semiconductor package structure according to one embodiment of the present disclosure;

FIG. 2 is a schematic vertical view of a structure obtained after providing a wafer in the method for fabricating a semiconductor package structure according to one embodiment of the present disclosure;

Figure 3:
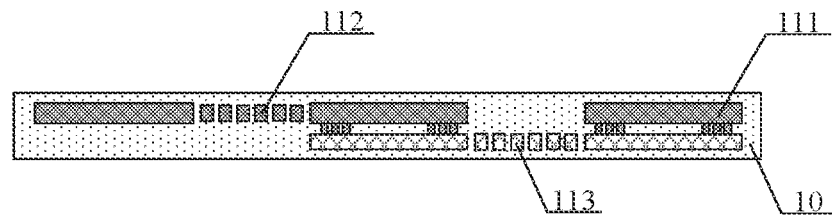
FIG. 3 is a schematic structural cross-sectional diagram along Direction AA in FIG. 2.

REFERENCE NUMBERS IN THE ACCOMPANYING DRAWINGS wafer 10;
scribe line 101;
chip area 102;
test pad 111;
first test structure 112;
second test structure 113;
protective layer 12;
thinned area 121;
thickened area 122;
opening area 123;
first photomask 13;
first light-transmitting areas 131 and 151;
second photomask 14;
second light-transmitting areas 141 and 152;
photomask 15;
passivation layer 16; and
opening 161.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

It is to be noted that when an element is referred to as being "connected" to another element, it can be directly connected to the other element and be integrated with the other element as a whole, or intervening elements may be present. Terms "installation", "one end" and "another end" used herein and similar expressions are merely for purposes of illustration.

Unless otherwise defined, all technical and scientific terms used herein have the same meaning as commonly understood by one of ordinary skill in the art to which the present disclosure belongs. The terms used in the specification of the present disclosure are merely for the purpose of describing particular embodiments and are not intended for limiting the present disclosure. As used herein, the term "and/or" includes any and all combinations of one or more of the associated listed items.

In one embodiment, as shown in FIG. 1, a method for fabricating a semiconductor structure provided by the present disclosure includes following steps.

In Step S11, a wafer is provided, in the wafer there is formed a scribe line, and in the scribe line there is provided with a test pad, a first test structure, and a second test structure. The second test structure is positioned below the first test structure, and a transverse pitch between the second test structure and the first test structure is at least equal to a width of the test pad.

In Step S12, a protective layer is formed on the wafer, and the protective layer covers the scribe line.

In Step S13, the protective layer is exposed and developed, such that a thickness of the protective layer remained above the first test structure is greater than that of the protective layer remained above the second test structure.

According to the method for fabricating the semiconductor structure, the protective layer 12 above the second test structure 113 in the scribe line 101 is removed and thinned, such that the quantity of the protective layer 12 in the scribe line 101 may be reduced. When sawing the wafer using a saw blade, the protective layer 12 may be prevented from sticking to the saw blade, and thus a production capacity is increased, and fabrication costs are saved.

In one example, as shown in FIG. 2 and FIG. 3, the wafer 10 provided in Step S11 may include, but is not limited to, a silicon wafer. The scribe line 101 divides the wafer 10 into a plurality of chip areas 102. The number of the scribe lines 101 in the wafer and the number of the chip areas 102 separated by the scribe lines 101 may be set according to actual needs, and are not limited here.

In one example, a chip (not shown) may be formed in the chip area 102. The first test structure 112 may be configured for partial electrical tests such as a wafer acceptance test (WAT), and quality tests such as an Electro-Migration (EM) test or a Stress-Migration (SM) test, etc.

Figure 4:
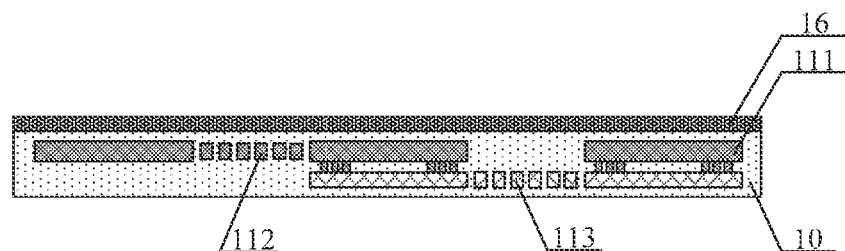
FIG. 4 is a schematic structural cross-sectional diagram of a structure obtained after forming a passivation layer on an upper surface of the wafer in the method for fabricating a semiconductor package structure according to one embodiment of the present disclosure.

In one example, after the Step S11, the fabrication method also includes following step: forming a passivation layer 16 on the upper surface of the wafer 10, as shown in FIG. 4. The passivation layer 16 covers the scribe line 101 and the chip area 102. The passivation layer 16 may include a single-layer structure or may be a laminated structure including multilayer material layers. The passivation layer 16 may include but is not limited to at least one of a silicon oxide layer, a silicon nitride layer, and a silicon oxynitride layer.

Figure 5:
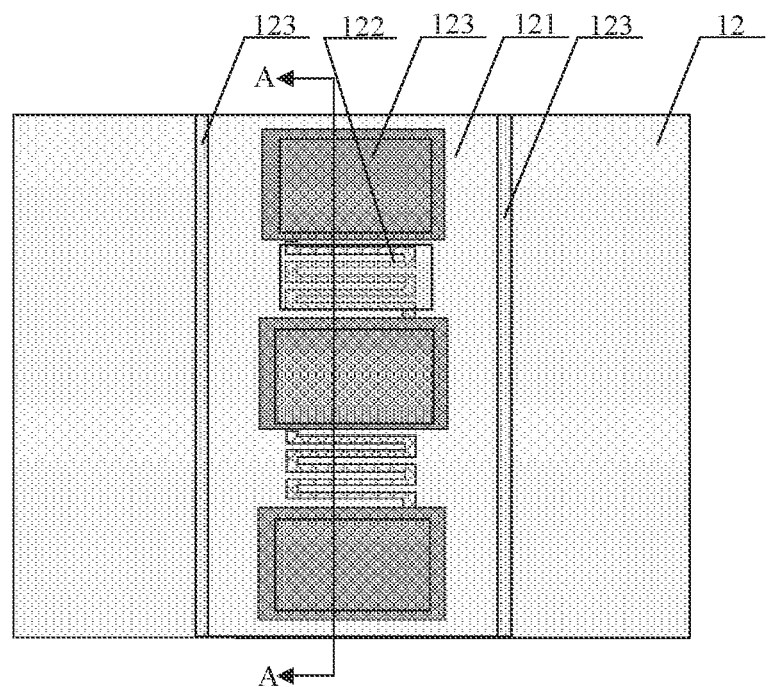
FIG. 5 is a schematic vertical view of a structure obtained after forming a protective layer on an upper surface of the passivation layer in the method for fabricating a semiconductor package structure according to one embodiment of the present disclosure.
Figure 6:
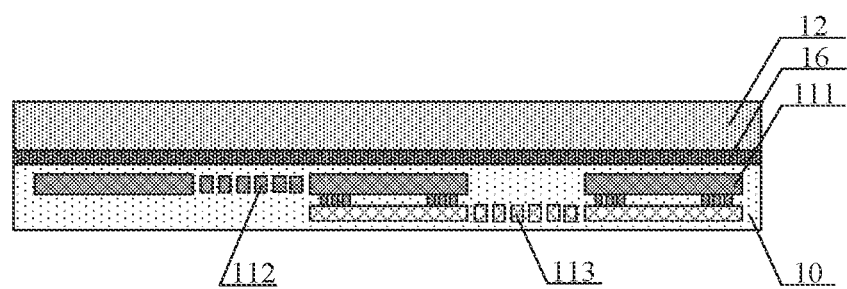
FIG. 6 is a schematic structural cross-sectional diagram along Direction AA in FIG. 5.

In one example, as shown in FIG. 5 and FIG. 6, the protective layer 12 may be formed on the upper surface of the passivation layer 16 by using, but not limited to, a spin coating process.

In one example, the protective layer 12 may include any type of integrated circuit protective layers that can be removed by exposure and development, such as a photosensitive material layer. In one embodiment, the protective layer 12 may include, but is not limited to, a polyimide layer or a polybenzox (PBO) layer.

In one example, the protective layer 12 may include a thinned area 121, a thickened area 122, and an opening area 123. The thickened area 122 is an area of the protective layer 12 corresponding to the first test structure 112. The thinned area 121 at least is an area of the protective layer 12 corresponding to the second test structure 113. The opening area 123 is an area of the protective layer 12 corresponding to between the test pad 111 and the thinned area 121 and an edge of the scribe line 101.

In some embodiments, the Step S13 may include following steps.

Figure 7:
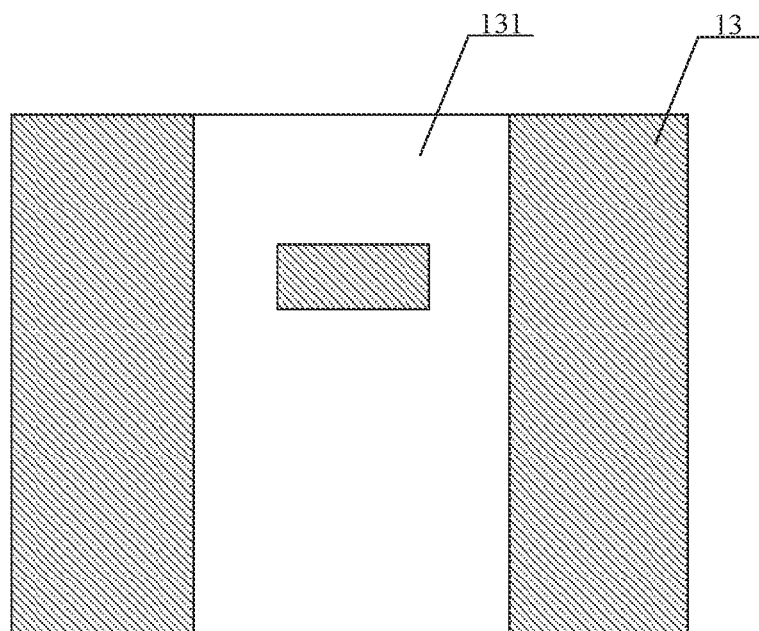
FIG. 7 is a schematic vertical view of a first photomask used in the method for fabricating a semiconductor package structure according to one embodiment of the present disclosure.

In Step S131, a first photomask 13 is placed above the protective layer 12. There is formed a first light-transmitting area 131 in an area, to which the first photomask 13 corresponds, of the scribe line 101 other than the first test structure 112. That is, there is formed the first light-transmitting area 131 in an area, to which the first photomask 13 at least corresponds, of the thinned area 121. The first photomask 13 is as shown in FIG. 7. After the first photomask 13 is placed above the protective layer 12, an orthographic projection of the photomask 13 on an upper surface of the protective layer 12 may completely cover an upper surface of the photomask 13.

In Step S132, a first exposure is performed on the protective layer 12 based on the first photomask 13 at a first exposure dose or a first exposure energy.

Figure 8:
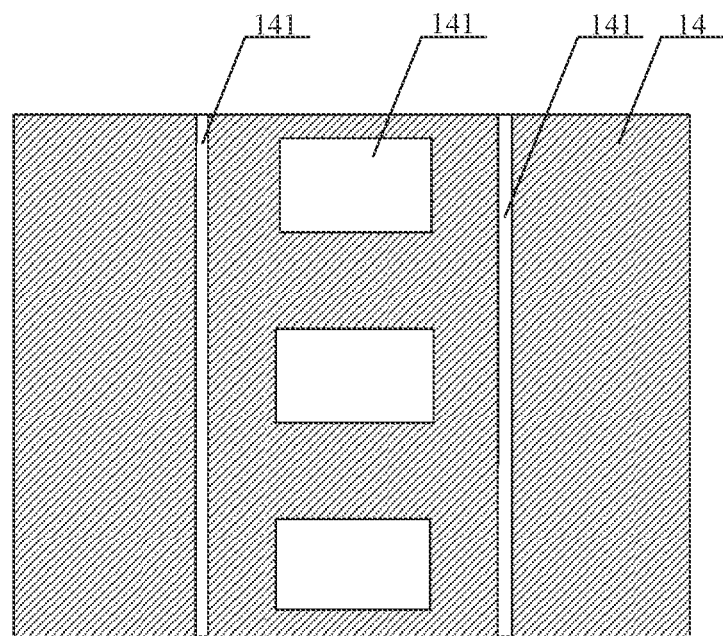
FIG. 8 is a schematic vertical view of a second photomask provided in the method for fabricating a semiconductor package structure according to one embodiment of the present disclosure.

In Step S133, the first photomask 13 is removed, and a second photomask 14 is placed above the protective layer 12. There is formed a second light-transmitting area 141 in an area, to which the second photomask 14 at least corresponds, of the test pad 111. That is, there is formed the second light-transmitting area 141 in an area, to which the second photomask 14 corresponds, of the opening area 123. The second photomask 14 is as shown in FIG. 8. After the second photomask 14 is placed above the protective layer 12, the orthographic projection of the second photomask 14 on the upper surface of the protective layer 12 may completely cover the upper surface of the protective layer 12.

In Step S134, a second exposure is performed on the protective layer 12 based on the second photomask 14 at a second exposure dose or a second exposure energy. The second exposure dose is a minimum exposure dose at which the protective layer 12 in an exposure area of the second exposure is completely removed after subsequent development. The second exposure energy is a minimum exposure energy at which the protective layer 12 in the exposure area of the second exposure is completely removed after the subsequent development. The second exposure dose is greater than the first exposure dose, and the second exposure energy is greater than the first exposure energy.

In Step S135, a development is performed on the exposed protective layer 12, such that the thickness of the protective layer 12 remained in the thinned area 121 is smaller than that of the protective layer 12 after the development.

The first exposure is performed based on the first photomask 13 at the first exposure dose or the first exposure energy. An exposure depth of the first light-transmitting area 131 is smaller than the thickness of the protective layer 12 because the first exposure dose or the first exposure energy is smaller. That is, only a part of the protective layer 12 can be removed during the development of the exposure area after the first exposure. The second exposure is performed based on the second photomask 14 at the second exposure dose or the second exposure energy. The remaining protective layer 12 can be completely removed during the development of the exposure area after the second exposure because the second exposure dose or the second exposure energy is larger. That is, the protective layer 12 in the opening area 123 can be completely removed after the development. The protective layer 12 in the thickened area 122 is masked and thus is not exposed in the processes of the first exposure and the second exposure. Therefore, the thickness of the protective layer 12 in the thickened area 122 does not change at all after the development compared with that before the exposure and development.

In the above example, the thickened area 122 and the opening area 123 are provided for the protective layer 12 in the scribe line 101. The protective layer 12 of the thickened area 122 is not thinned or removed in the process of lithography development. That is, the protective layer 12 above the first test structure 112 is not thinned or removed. In this way, it may be ensured that the thickness of the protective layer 12 covering the first test structure 112 can meet needs of tests, thereby avoiding risks of poor test quality.

It is to be noted that in addition to corresponding to the thinned area 121, the first light-transmitting area 131 also corresponds to the opening area 123.

Figure 9:
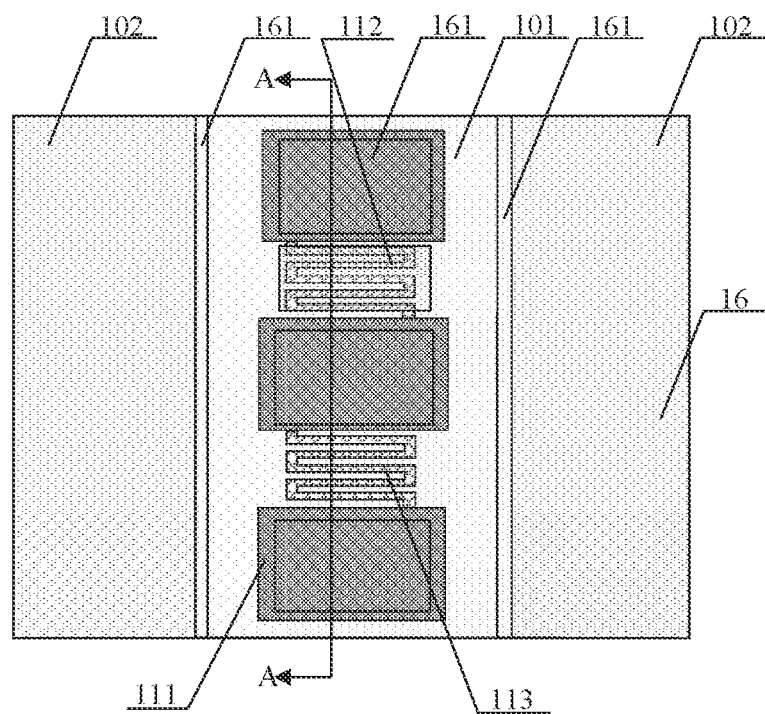
FIG. 9 is a schematic vertical view of a structure obtained after performing double exposure using the first photomask and the second photomask and performing development in the method for fabricating a semiconductor package structure according to one embodiment of the present disclosure.
Figure 10:
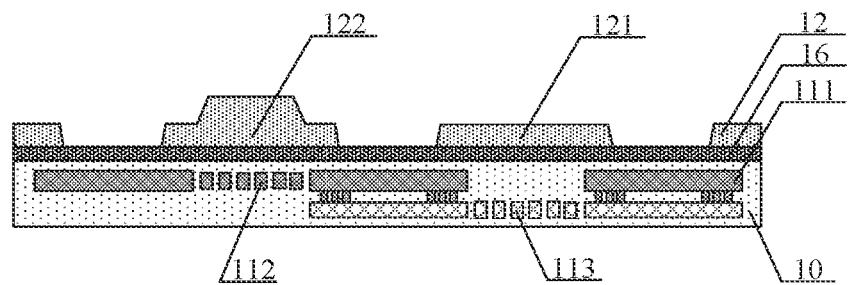
FIG. 10 is a schematic structural cross-sectional diagram along Direction AA in FIG. 9.

In one example, a schematic vertical view of a structure obtained after the development is as shown in FIG. 9, and a schematic structural partial cross-sectional diagram is as shown in FIG. 10.

In one example, the protective layer 12 also covers the chip area 102; and the thickness of the protective layer 12 remained above the first test structure 112 is 1.5 to 4 times that of the protective layer 12 remained above the second test structure 113. That is, the thickness of the protective layer 12 in the thickened area 122 is the same as that of the protective layer 12 covering the chip area 102, which is 1.5 to 4 times the thickness of the protective layer 12 in the thinned area 121.

In one example, after the Step S13, the fabrication method further includes following steps.

In Step S14, the protective layer 12 is cured. In one embodiment, the protective layer 12 may be cured by using, but not limited to, a baking technology.

Figure 11:
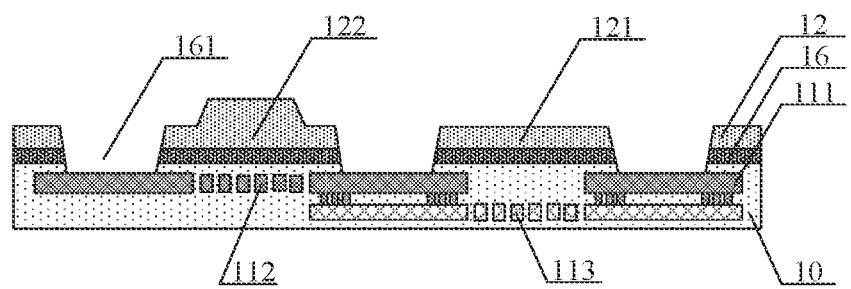
FIG. 11 is a schematic structural cross-sectional diagram of a structure obtained after forming an opening 161 by etching in the method for fabricating a semiconductor package structure according to one embodiment of the present disclosure.

In Step S15, the passivation layer 16 in the area corresponding to the test pad 111 and a part of the wafer 10 are removed by etching to form an opening 161 revealed from the test pad 111, as shown in FIG. 11. In one embodiment, the passivation layer 16 in the area corresponding to the test pad 111 and a part of the wafer 10 may be removed by using, but not only limited to, an etching process.

Figure 12:
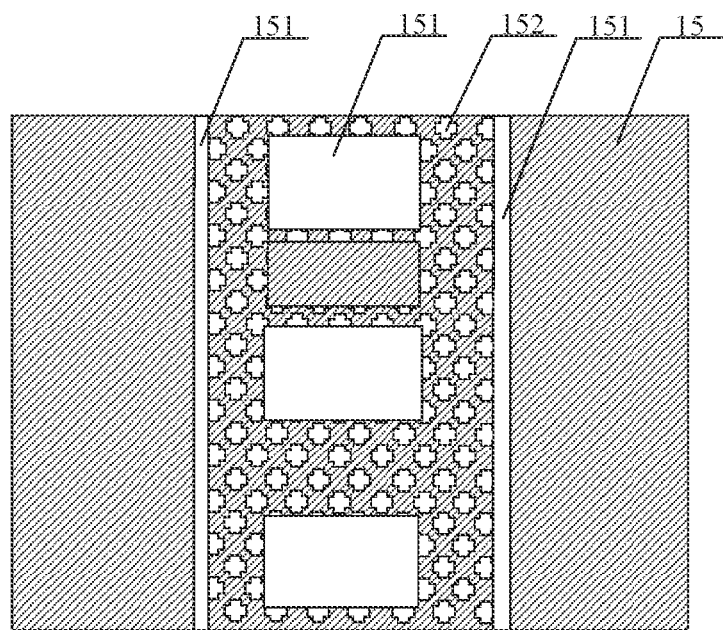
FIG. 12 is a schematic vertical view of a photomask used in the method for fabricating a semiconductor package structure according to another embodiment of the present disclosure.

In some embodiments, as shown in FIG. 12, the Step S13 may further include following steps.

In Step S131, a photomask 15 is placed above the protective layer 12. There is formed a plurality of first light-transmitting areas 151 in an area, to which the photomask 15 corresponds, of the scribe line 101 other than the first test structure 112, and there is formed a second light-transmitting area 152 in an area, to which the photomask 15 at least corresponds, of the test pad 111. That is, there is formed the plurality of first light-transmitting areas 151 in an area, to which the photomask 15 corresponds, of the thinned area 121; and there is formed the second light-transmitting area 152 in an area, to which the photomask 15 corresponds, of the opening area 123. After the photomask 15 is placed above the protective layer 12, an orthographic projection of the photomask 15 on the upper surface of the protective layer 12 can completely cover the upper surface of the protective layer 12.

In Step S132, the protective layer 12 is exposed based on the photomask 15.

In Step S133, a development is performed on the exposed protective layer 12, such that the thickness of the protective layer 12 remained above the first test structure 112 is greater than that of the protective layer 12 remained above the second test structure 113 after the development. That is, the thickness of the protective layer 12 remained in the thinned area 121 is smaller than that of the protective layer 12.

The first light-transmitting area 151 has a smaller size. Therefore, the depth of the protective layer 12 exposed in the first light-transmitting area 151 is smaller than that of the protective layer 12 itself in the process of exposure due to effects such as diffraction of exposure light. In the process of development, only a part of the protective layer 12 in the exposure area of the first light-transmitting area 151 is removed.

In one example, the plurality of first light-transmitting areas 131 may be arranged in strips at intervals, or may be arranged crosswise, or may be arranged randomly. In one embodiment, in the case where the plurality of first light-transmitting areas 131 are arranged randomly, the plurality of first light-transmitting areas 131 may have the same shape, but the plurality of first light-transmitting areas 131 are arranged desultorily. In another embodiment, in the case where the plurality of first light-transmitting areas 131 are arranged randomly, the plurality of first light-transmitting areas 131 may have different shapes, and the plurality of first light-transmitting areas 131 are arranged desultorily, etc.

In some embodiments, with continued reference to FIG. 2 to FIG. 12, the present disclosure also provides a semiconductor structure. The semiconductor structure includes: a wafer 10 having a scribe line 101 internally provided with a test pad 111; a first test structure 112 positioned in the scribe line 101; a second test structure 113 positioned in the scribe line 101 and below the first test structure 112, wherein a transverse pitch between the second test structure 113 and the first test structure 112 is at least equal to the width of the test pad 111; and a protective layer 12 positioned above the first test structure 112 and the second test structure 113, wherein the thickness of the protective layer 12 above the first test structure 112 is greater than that of the protective layer 12 above the second test structure 113.

In the above semiconductor structure, the protective layer 12 above the second test structure 113 in the scribe line 101 is removed and thinned, such that the quantity of the protective layer 12 in the scribe line 101 may be reduced. When sawing the wafer using a saw blade, the protective layer may be prevented from sticking to the saw blade, and thus a production capacity is increased, and fabrication costs are saved.

In one example, as shown in FIG. 2 and FIG. 3, the wafer 10 provided in Step S11 may include, but is not limited to, a silicon wafer. The scribe line 101 divides the wafer 10 into a plurality of chip areas 102. The number of the scribe lines 101 in the wafer and the number of the chip areas 102 separated by the scribe lines 101 may be set according to actual needs, and are not limited here.

In one example, a chip (not shown) may be formed in the chip area 102. The first test structure 112 may be configured for partial electrical tests such as a wafer acceptance test (WAT), and quality tests such as an Electro-Migration (EM) test or a Stress-Migration (SM) test, etc.

In one example, the protective layer 12 may include any type of integrated circuit protective layers that can be removed by exposure and development, such as a photosensitive material layer. In one embodiment, the protective layer 12 may include, but is not limited to, a polyimide layer or a polybenzox (PBO) layer.

In one example, the protective layer 12 may include a thinned area 121, a thickened area 122, and an opening area 123. The thickened area 122 is an area of the protective layer 12 corresponding to the first test structure 112. The thinned area 121 at least is an area of the protective layer 12 corresponding to the second test structure 113. The opening area 123 is an area of the protective layer 12 corresponding to between the test pad 111 and the thinned area 121 and an edge of the scribe line 101.

In one example, the semiconductor structure further includes a passivation layer 16, which is positioned on the upper surface of the wafer 10; and the protective layer 12 is positioned on the upper surface of the passivation layer 16. The passivation layer 16 covers the scribe line 101 and the chip area 102. The passivation layer 16 may include a single-layer structure or may be a laminated structure including multilayer material layers. The passivation layer 16 may include but is not limited to at least one of a silicon oxide layer, a silicon nitride layer, and a silicon oxynitride layer.

In one example, an opening 161 is also formed in the protective layer 12; and the opening 161 penetrates through the protective layer 12 and the passivation layer 16 and extends into the wafer 10 to reveal the test pad 111.

In one example, the thickness of the protective layer 12 above the first test structure 112 is 1.5 to 4 times that of the protective layer 12 above the second test structure 113. That is, the thickness of the protective layer 12 in the thickened area 122 is the same as that of the protective layer 12 covering the chip area 102, which is 1.5 to 4 times the thickness of the protective layer 12 in the thinned area 121.

In the above example, the thickness of the protective layer 12 above the first test structure 112 is the same as that of the protective layer 12 in the chip area 102. That is, the thickness of the protective layer 12 in the thickened area 122 is the same as that of the protective layer 12 covering the chip area 102. In this way, it may be ensured that the thickness of the protective layer 12 covering the first test structure 112 can meet needs of tests, thereby avoiding risks of poor test quality.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a semiconductor structure, comprising:
    providing a wafer;
    forming a scribe line in the wafer, wherein a test pad, a first test structure and a second test structure are provided in the scribe line, the second test structure being positioned below the first test structure, and a transverse pitch between the second test structure and the first test structure being at least equal to a width of the test pad;
    forming a protective layer on the wafer, the protective layer at least covering the scribe line; and
    performing exposure and development on the protective layer to form a first protective area and a second protective area, wherein the first protective area covers the second test structure, and the second protective area covers the first test structure, and a thickness of the first protective area is less than that of the second protective area.

2. The method for fabricating a semiconductor structure according to claim 1, wherein performing the exposure and development on the protective layer comprises:
    placing a first photomask above the protective layer, forming a first light-transmitting area in an area of the first photomask corresponding to an area of the scribe line other than the first test structure;
    performing a first exposure on the protective layer based on the first photomask at a first exposure dose or a first exposure energy;
    removing the first photomask; placing a second photomask above the protective layer, forming a second light-transmitting area in an area of the second photomask corresponding to at least the test pad;
    performing a second exposure on the protective layer based on the second photomask at a second exposure dose or a second exposure energy; wherein the second exposure dose is a minimum exposure dose at which the protective layer in an exposure area of the second exposure is completely removed after subsequent development, and the second exposure energy is a minimum exposure energy at which the protective layer in the exposure area of the second exposure is completely removed after the subsequent development; the second exposure dose is greater than the first exposure dose, and the second exposure energy is greater than the first exposure energy; and
    performing the exposure and development on the protective layer to form the first protective area and the second protective area, wherein the first protective area covers the second test structure, and the second protective area covers the first test structure, and the thickness of the first protective area is less than that of the second protective area.

3. The method for fabricating a semiconductor structure according to claim 1, wherein the performing exposure and development on the protective layer comprises:
    placing a photomask above the protective layer, forming a plurality of first light-transmitting areas in an area of the photomask corresponding to an area of the scribe line other than the first test structure, and forming a second light-transmitting area in an area of the photomask corresponding to at least the test pad;
    performing an exposure on the protective layer based on the photomask; and
    performing the exposure and development on the protective layer to form the first protective area and the second protective area, wherein the first protective area covers the second test structure, and the second protective area covers the first test structure, and the thickness of the first protective area is less than that of the second protective area.

4. The method for fabricating a semiconductor structure according to claim 3, wherein the plurality of first light-transmitting areas are arranged in strips at intervals, or are arranged in grids, or are arranged randomly.

5. The method for fabricating a semiconductor structure according to claim 1, wherein before forming the protective layer on the wafer, the method further comprising:
    forming a passivation layer on an upper surface of the wafer, wherein the protective layer is formed on an upper surface of the passivation layer;

after performing development on the protective layer, the method further comprising:
curing the protective layer; and removing the passivation layer above the test pad and a part of the wafer by etching to reveal the test pad.

* * * * *